(12) United States Patent
Nakagawa et al.

(10) Patent No.: US 10,734,562 B2
(45) Date of Patent: Aug. 4, 2020

(54) METHOD FOR MANUFACTURING SUBSTRATE TERMINAL BOARD FOR MOUNTING SEMICONDUCTOR ELEMENT

(71) Applicants: SUNCALL CORPORATION, Kyoto (JP); STANLEY ELECTRIC CO., LTD., Tokyo (JP)

(72) Inventors: Masaya Nakagawa, Kyoto (JP); Shojiro Wakabayashi, Kyoto (JP); Mamoru Yuasa, Tokyo (JP); Toshifumi Watanabe, Tokyo (JP)

(73) Assignees: SUNCALL CORPORATION, Kyoto (JP); STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/349,450

(22) PCT Filed: Nov. 13, 2017

(86) PCT No.: PCT/JP2017/040692
§ 371 (c)(1),
(2) Date: May 13, 2019

(87) PCT Pub. No.: WO2018/092704
PCT Pub. Date: May 24, 2018

(65) Prior Publication Data
US 2019/0341538 A1  Nov. 7, 2019

(30) Foreign Application Priority Data
Nov. 17, 2016  (JP) .................................. 2016-224343

(51) Int. Cl.
*H01L 33/64*  (2010.01)
*H01L 33/62*  (2010.01)

(52) U.S. Cl.
CPC ............ *H01L 33/647* (2013.01); *H01L 33/62* (2013.01); *H01L 2933/0066* (2013.01); *H01L 2933/0075* (2013.01)

(58) Field of Classification Search
CPC ......... F21V 29/75; H01L 23/12; H01L 23/36; H01L 33/62; H01L 33/64; H01L 33/647;
(Continued)

(56) References Cited

U.S. PATENT DOCUMENTS

2010/0290241 A1  11/2010  Tsukamoto
2011/0058342 A1*  3/2011  Kawakita ............ H01L 23/3135
361/735

FOREIGN PATENT DOCUMENTS

JP  2003-164040 A  6/2003
JP  2008-153493 A  7/2008
(Continued)

OTHER PUBLICATIONS

International Search Report and Written Opinion of the International Search Report for PCT/JP2017/040692 dated Jan. 9, 2018.

*Primary Examiner* — Daniel P Shook
(74) *Attorney, Agent, or Firm* — Kenealy Vaidya LLP

(57) ABSTRACT

Some embodiments provide a substrate terminal board in which the number of components is reduced by utilizing a conductor board per se constituting the substrate terminal board while ensuring heat dissipation, and which has a simple structure. Heat-dissipation fins can be cut and raised at a plurality of positions around element mounting portions of an upper-substrate conductor board, thus providing heat-dissipation fins and heat-dissipation openings. The upper-substrate conductor board can be coated with a paint film to form an upper substrate. A lower-substrate conductor board can be coated with the paint film to form a lower substrate. In a pressing/heating process, the lower substrate and the upper substrate can overlap each other and be vertically (Continued)

pressed while the lower substrate and the upper substrate are heated to completely cure the paint film, thereby causing the paint film on the lower substrate and the paint film on the upper substrate to adhere to each other.

6 Claims, 8 Drawing Sheets

(58) Field of Classification Search
CPC .... H01L 2933/0066; H01L 2933/0075; H05K 7/20
See application file for complete search history.

(56) References Cited

FOREIGN PATENT DOCUMENTS

| | | |
|---|---|---|
| JP | 2008-192940 A | 8/2008 |
| JP | 2010-267468 A | 11/2010 |
| JP | 2011-129440 A | 6/2011 |
| JP | 2016-92183 A | 5/2016 |
| WO | 2018/092704 A1 | 5/2018 |

* cited by examiner

[FIG. 1A]
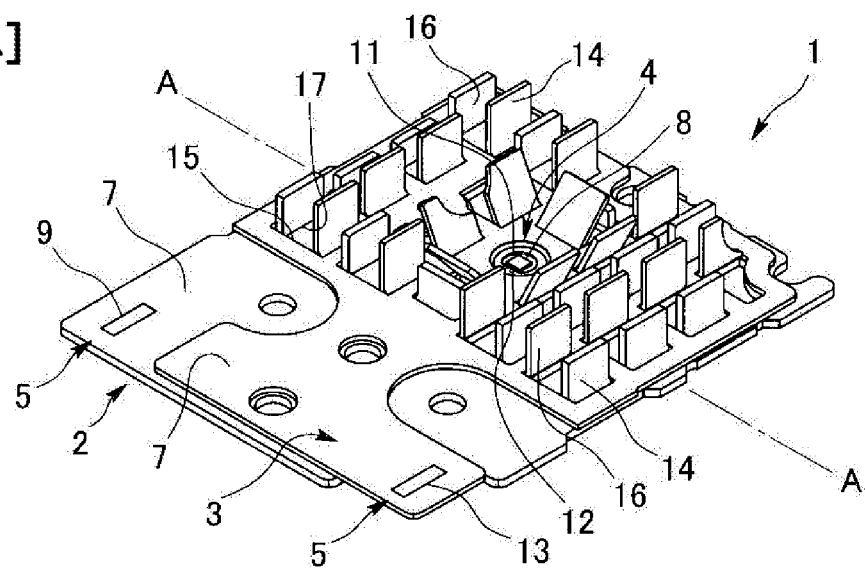
[FIG. 1B]
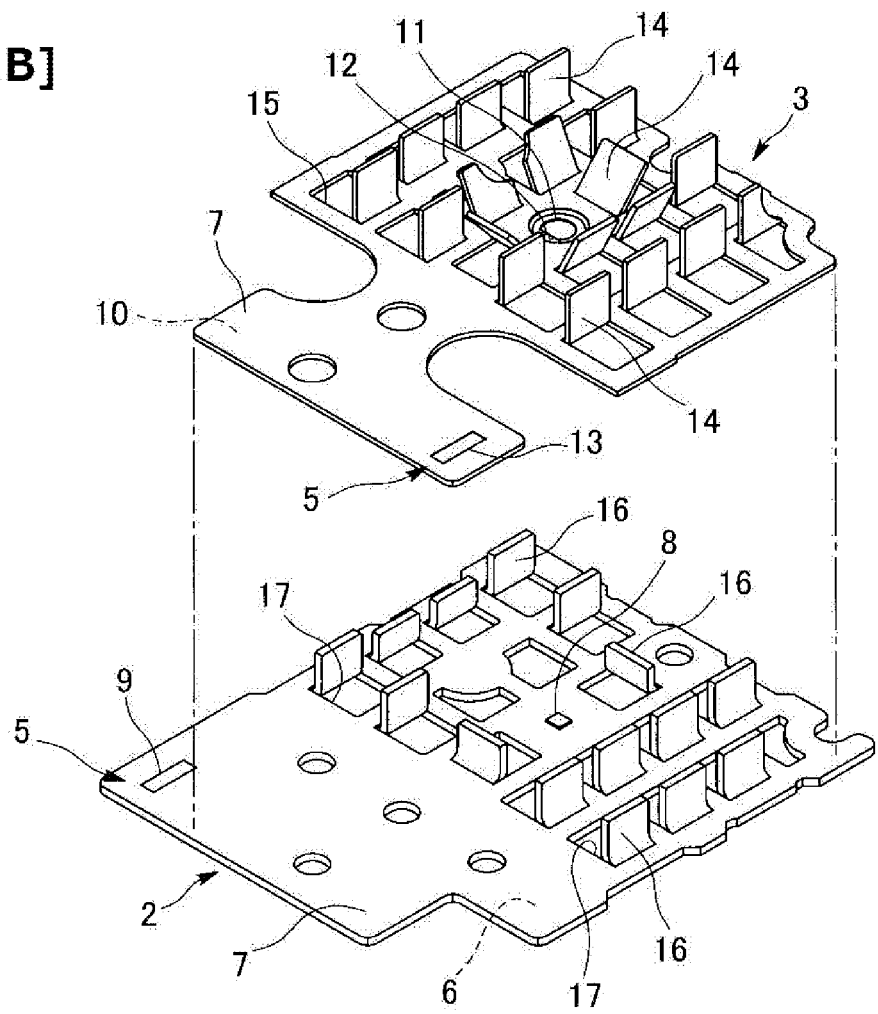

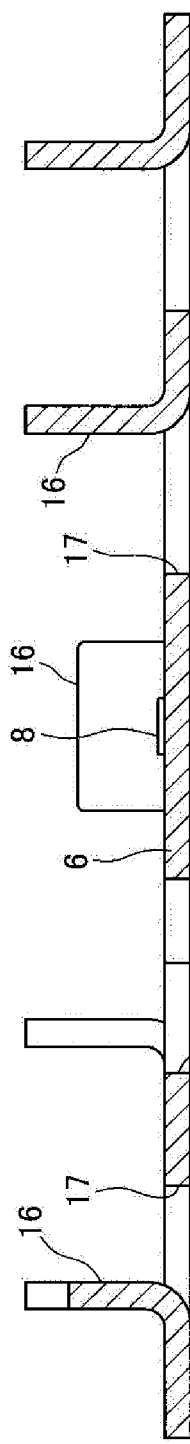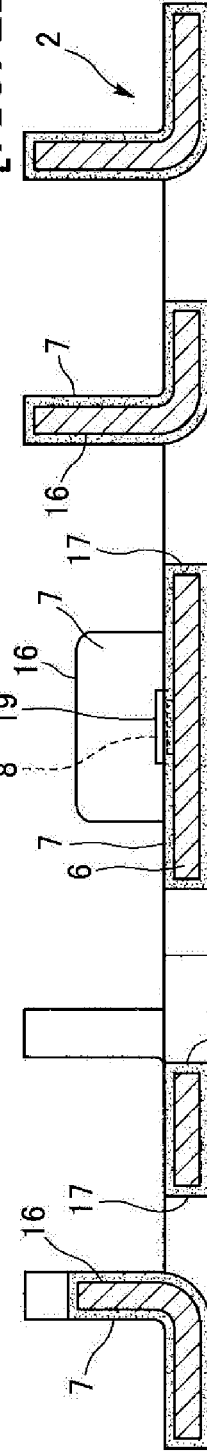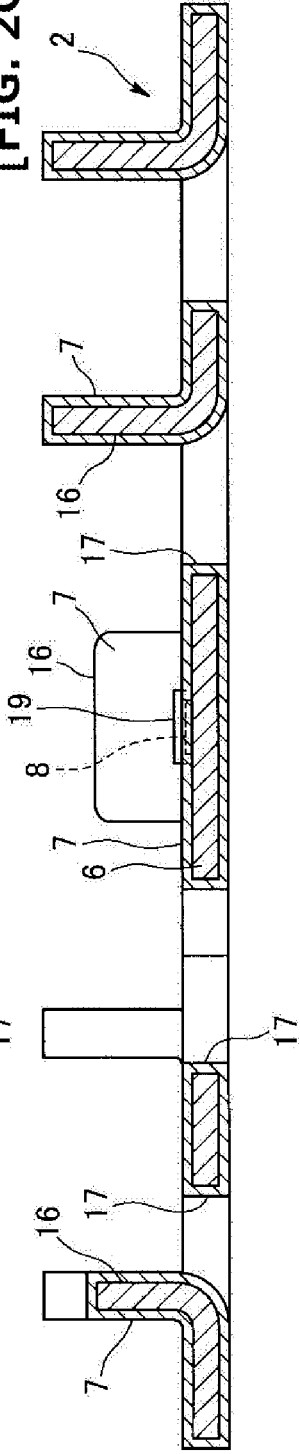

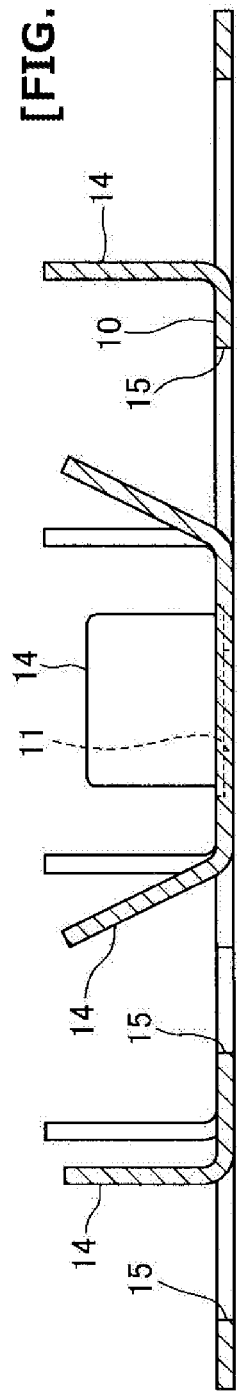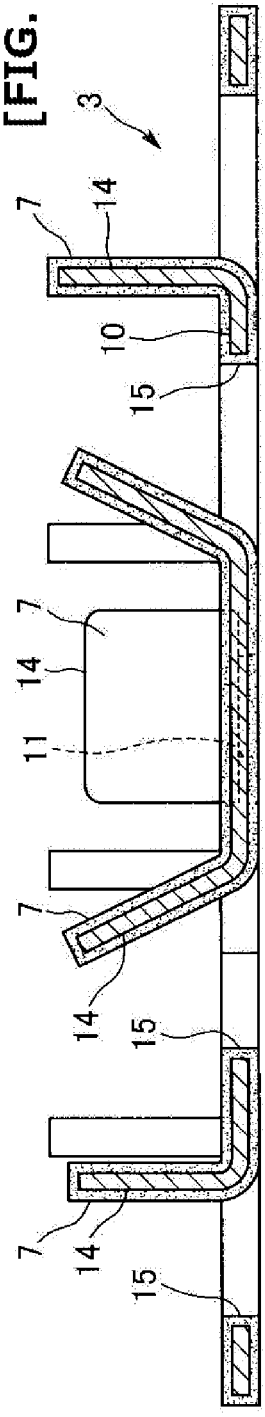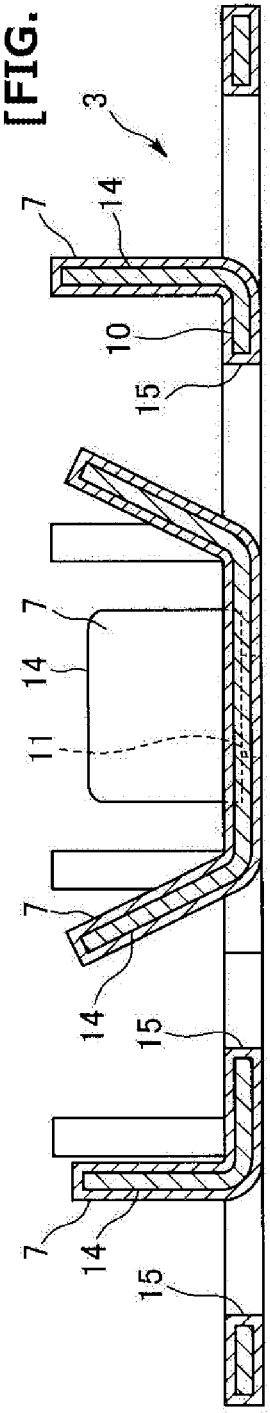

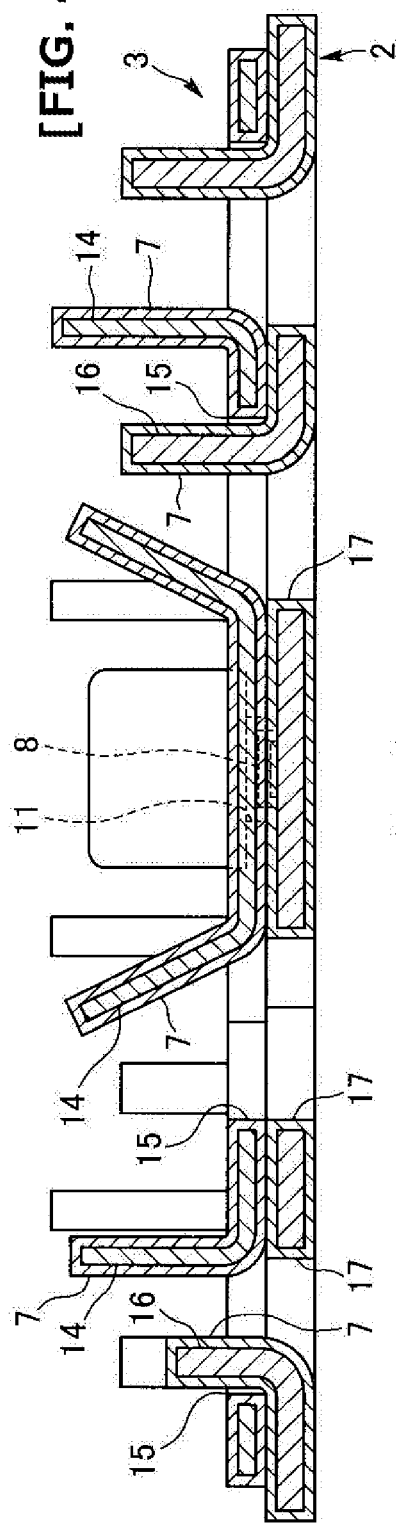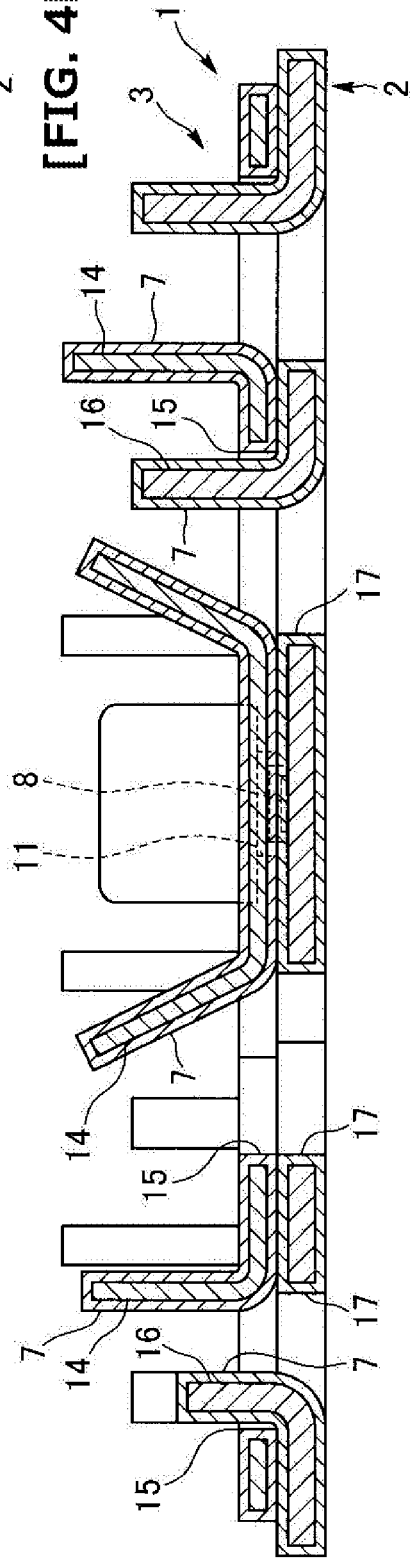

[FIG. 5A]
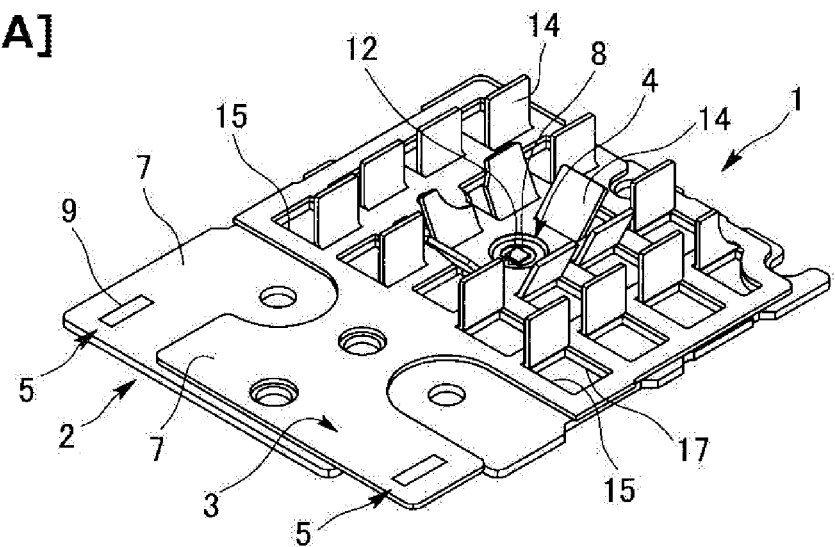
[FIG. 5B]
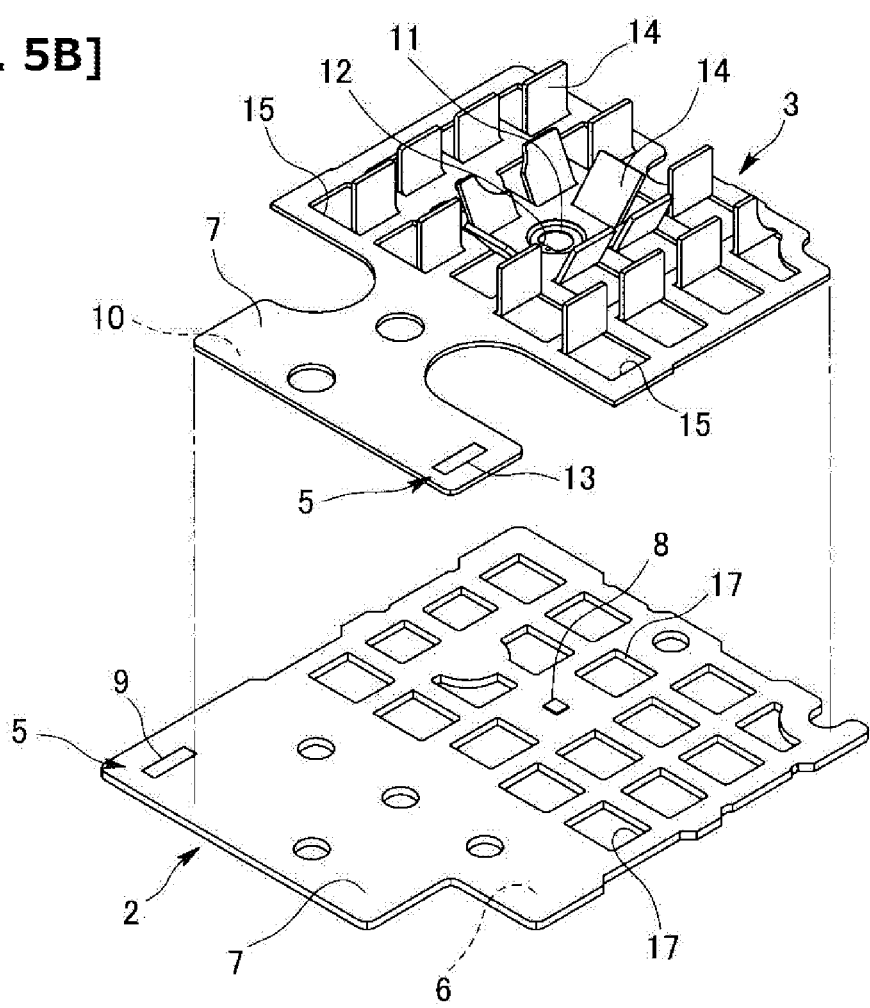

[FIG. 6A]
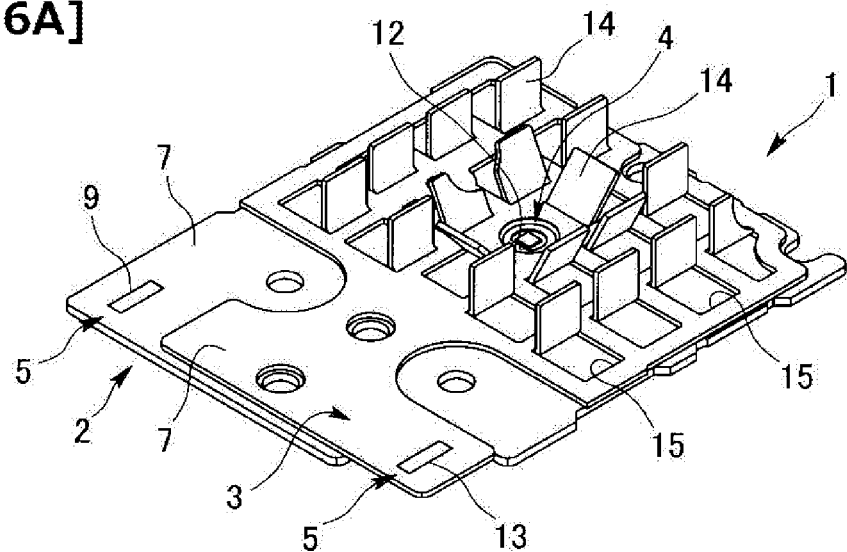
[FIG. 6B]
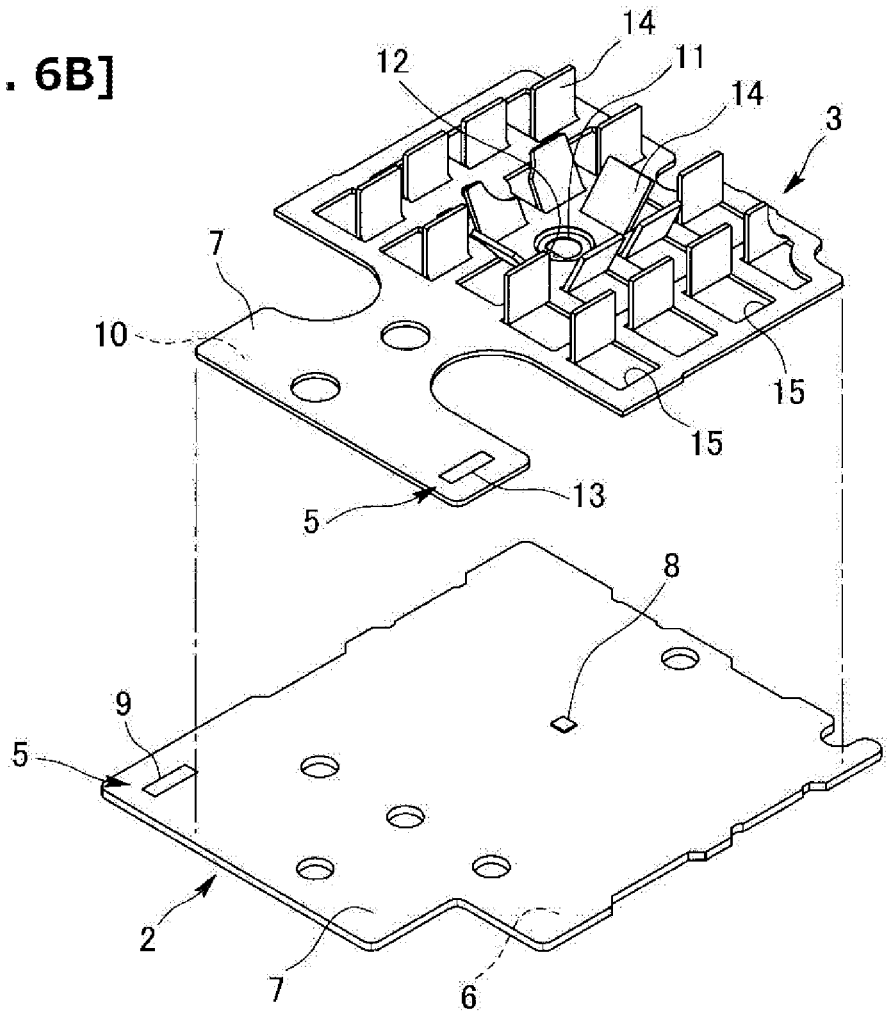

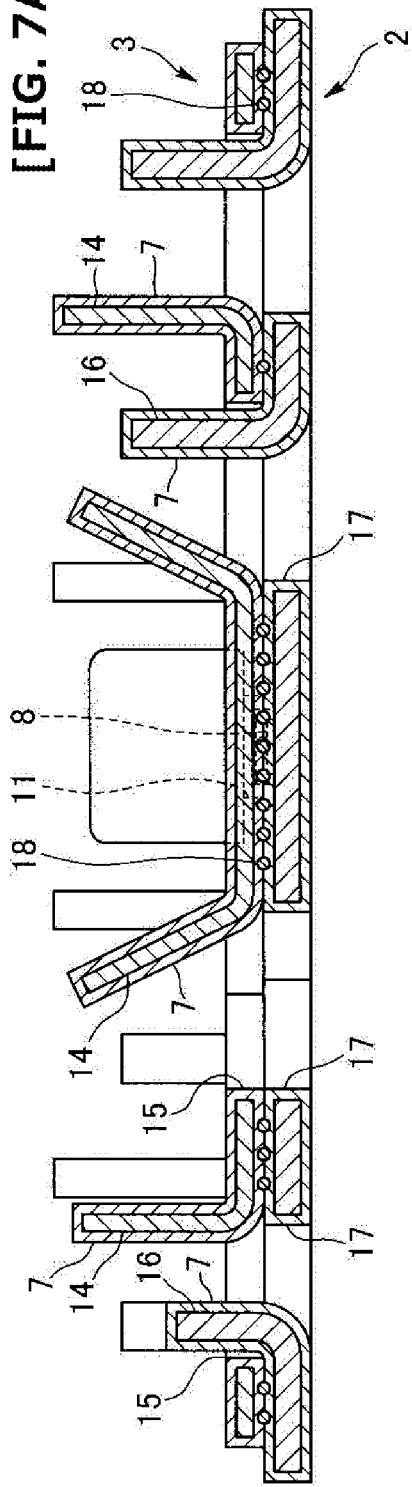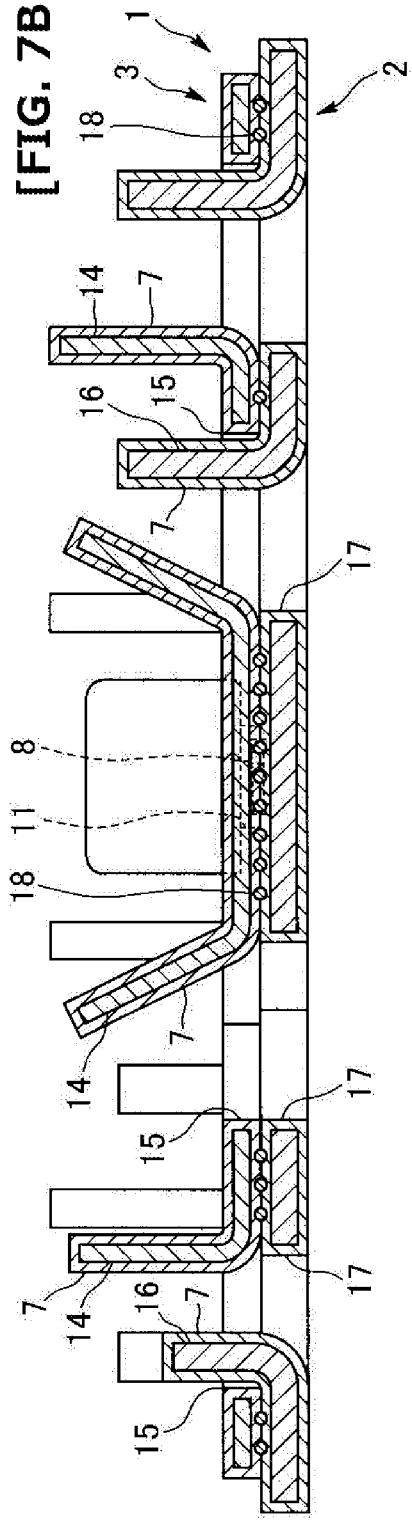

[FIG. 8A]
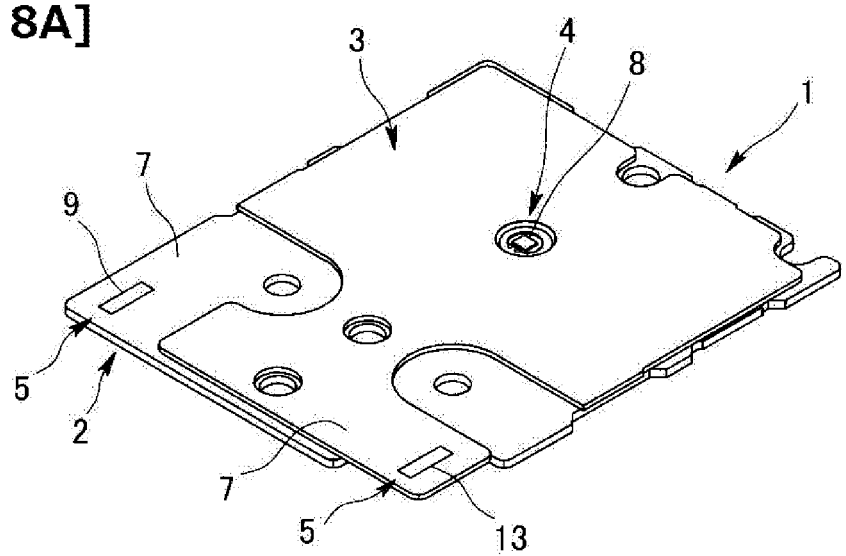
[FIG. 8B]
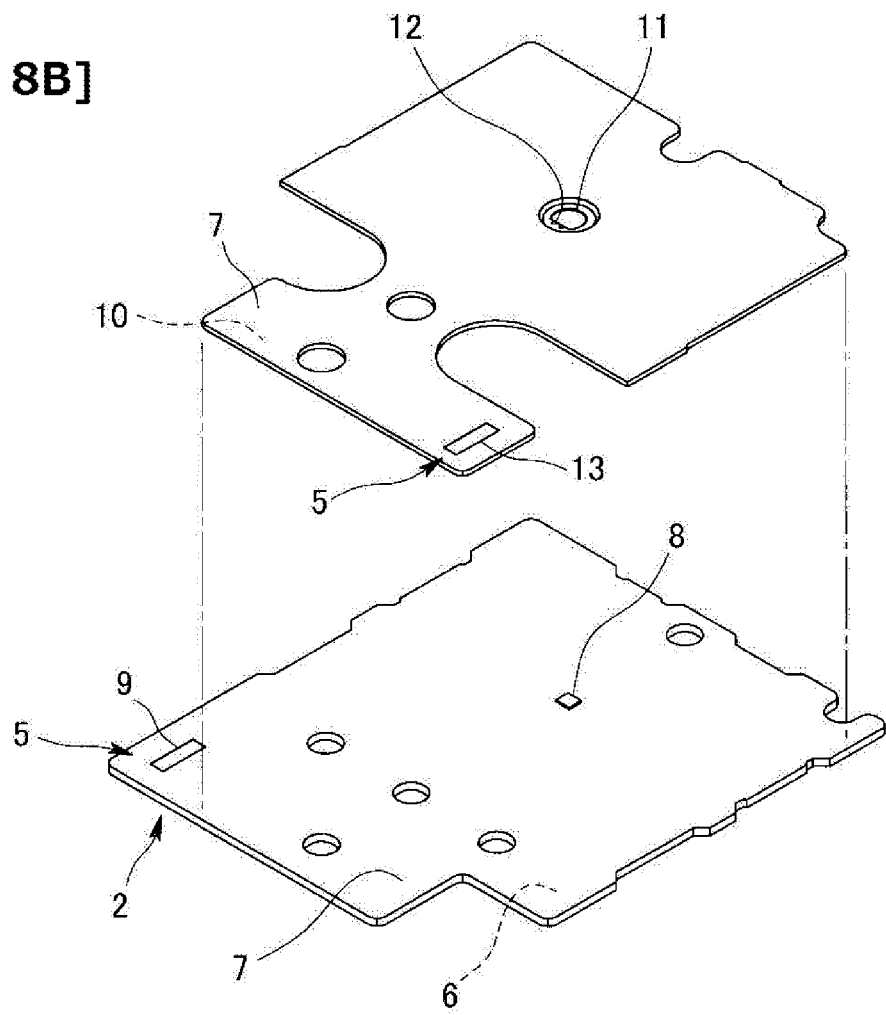

METHOD FOR MANUFACTURING SUBSTRATE TERMINAL BOARD FOR MOUNTING SEMICONDUCTOR ELEMENT

CROSS-REFERENCE TO RELATED APPLICATIONS

This application is a U.S. National Stage Application under 35 U.S.C § 371 of International Patent Application No. PCT/JP2017/040692 filed 13 Nov. 2017, which claims the benefit of priority to Japanese Patent Application No. 2016-224343 filed 17 Nov. 2016, the disclosures of all of which are hereby incorporated by reference in their entireties.

FIELD

The present invention relates to a method for manufacturing a substrate terminal board for mounting a semiconductor device, the substrate terminal board having a portion for mounting a semiconductor device, for example, an LED chip, an LSI, a CPU, or the like, which consumes a large amount of power and generates a large amount of heat, and also having a terminal portion for connecting to an electrode wire.

BACKGROUND

Conventionally, some LED devices with high power consumption have a configuration in which a chip is enclosed in a glass epoxy material and a terminal is exposed. Since this type of LED device generates a large amount of heat, as shown in Patent Literatures 1, 2, and 3, a base substrate serving also as a heat dissipation plate is bonded to a substrate to which the LED device is attached, a heat sink is attached as a separate member to a surface of an LED mounting substrate opposite to the mounting surface of the LED device, and a heat dissipation plate is superposed on the opposite surface of the LED mounting substrate via a heat conductive sheet, and plate pieces cut and raised are provided to the heat dissipation plate.

CITATION LIST

Patent Literature

Patent Literature 1: Japanese Patent Application Laid-Open No. 2010-267468
Patent Literature 1: Japanese Patent Application Laid-Open No. 2008-192940
Patent Literature 1: Japanese Patent Application Laid-Open No. 2011-129440

SUMMARY

Technical Problem

However, the above-described conventional technique has a problem that the number of components increases since a heat dissipation plate or a heat sink, which is a separate component, is attached to the substrate on which an LED device is mounted or a substrate to which an LED chip is connected (a substrate connected to the LED chip by wire bonding). In addition, there is a problem that the heat loss increases due to the increase in the surface where the parts overlap with each other, and heat from the LED device and the LED chip is difficult to escape.

In addition, the heat dissipation plate and the heat sink which are separate components must be attached so as to be in close contact with the counter component, and there is a problem that the operation of attaching the heat dissipation plate and the heat sink becomes complicated.

The above-mentioned points are not limited to those for LED devices and LED chips, but also those for semiconductor device products such as LSIs and CPUs which generate heat have the same drawbacks.

In view of the above-described circumstances, the present invention has an object reducing the number of components while ensuring the heat dissipation property by using the conductor plate itself constituting the substrate terminal board, and has an object of obtaining a substrate terminal board having good heat dissipation even with a simple structure.

Solution to Problem

The present invention has been made in consideration of the above-mentioned problems, and provides a method for manufacturing a substrate terminal board for mounting a semiconductor device having a device mounting portion in which a semiconductor device can be disposed, and an electrode terminal portion in which an electrode wire for supplying electricity to a semiconductor device disposed in the device mounting portion can be mounted, by superposing an upper substrate and a lower substrate each having conductivity, the method comprising:

forming the upper substrate by cutting and raising an upper substrate conductor plate formed of a conductive metal plate at a plurality of positions for heat dissipation fins in the upper substrate conductor plate around the device mounting portion to provide the heat dissipation fins and heat dissipation openings opened by cutting and raising the heat dissipation fins, and then by covering the upper substrate conductor plate with an insulating paint fil;

forming the lower substrate by covering a lower substrate conductor plate formed of a conductive metal plate with an insulating paint film; and bonding the paint film of the lower substrate and the paint film of the upper substrate to each other by superposing the lower substrate and the upper substrate on each other, and subjecting them to a pressure heating treatment by pressurizing them from above and below while heating, to completely cure the paint film, so that the substrate terminal board for mounting a semiconductor device is obtained in which the lower substrate and the upper substrate are connected in a laminated state electrically insulated from each other by the bonding, and the heat dissipation fins coated with the paint film in a raised shape are located at side portions of the heat dissipation openings around the device mounting portion, thereby solving the above-mentioned problem.

In the present invention, the lower substrate conductor plate is provided with heat dissipation openings at positions corresponding to the heat dissipation openings in the upper substrate conductor plate, and the lower substrate conductor plate provided with the heat dissipation openings is coated with the paint film to form the lower substrate.

In addition, in the present invention, the method comprising:

forming the lower substrate by cutting and raising the lower substrate conductor plate at positions corresponding to the heat dissipation openings in the upper substrate conductor plate to provide heat dissipation fins insertable into the heat dissipation openings in the upper substrate conductor plate and heat dissipation openings opened by cutting and raising the heat dissipation fins, and then by covering the lower substrate conductor plate provided with the heat dissipation fins and the heat dissipation openings with the paint film; and superposing the lower substrate and the upper substrate on each other so that the heat dissipation fins of the lower substrate are inserted into the heat dissipation openings of the upper substrate and the heat dissipation openings of the lower substrate are positioned corresponding to the heat dissipation openings of the upper substrate, wherein by superposing the lower substrate and the upper substrate, the heat dissipation openings of the lower substrate and the heat dissipation openings of the upper substrate overlap with each other to form a penetrating portion passing in a terminal board thickness direction, so that the heat dissipation fins of the lower substrate are erected in the same direction as the heat dissipation fins of the upper substrate through the heat dissipation openings of the upper substrate.

In addition, in the present invention, the method comprising:

completely curing the paint film of the lower substrate by subjecting the lower substrate to a heat treatment before the lower substrate and the upper substrate are superposed on each other, and half-curing the paint film of the upper substrate by subjecting the upper substrate to a heat treatment before the lower substrate and the upper substrate are superposed on each other; and bonding the paint film of the lower substrate and the paint film of the upper substrate by superposing the lower substrate, in which the paint film has been completely cured, and the upper substrate, in which the paint film has been half-cured, on each other and by subjecting the superposed lower substrate and upper substrate to a pressure heating treatment to completely cure the half-cured paint film of the upper substrate, thereby.

In addition, in the present invention, the method comprising:

half-curing the paint film of the lower substrate by subjecting the lower substrate to a heat treatment before the lower substrate and the upper substrate are superposed on each other, and half-curing the paint film of the upper substrate by subjecting the upper substrate to a heat treatment before the lower substrate and the upper substrate are superposed on each other; and bonding the paint film of the lower substrate and the paint film of the upper substrate with the space holding member interposed therebetween by superposing the lower substrate, in which the paint film has been half-cured, and the upper substrate, in which the paint film has been half-cured, on each other with a space holding member interposed between the paint film of the lower substrate and the paint film of the upper substrate, and by subjecting the superposed lower substrate and upper substrate to the pressure heating treatment to completely cure the half-cured paint film of the upper substrate, thereby.

In the present invention, the heat dissipation fins positioned in a vicinity of the device mounting portion are cut and raised at an angle inclined toward the outside opposite to the device mounting portion side.

Advantageous Effects of Invention

According to one aspect of the present invention, since the upper substrate itself constituting the substrate terminal board for mounting a semiconductor device is provided with the heat dissipation fins and this upper substrate is superposed on the lower substrate, the effect that the substrate terminal board for mounting a semiconductor device with improved heat dissipation property can be obtained at low cost with a simple configuration without mounting a separate component such as a heat dissipation plate and a heat sink.

According to another aspect of the present invention, since the lower substrate is provided with the heat dissipation openings corresponding to the positions of the heat dissipation openings of the upper substrate, openings penetrating in the thickness direction of the terminal board are formed in the substrate terminal board for mounting a semiconductor device. Therefore, convection of air around the substrate terminal board for mounting a semiconductor device passes through the heat dissipation openings due to heat generation of the semiconductor device like a lit LED or the like, and the air of the convection flows while touching the heat dissipation fins, so that the heat dissipation property of the substrate terminal board for mounting a semiconductor device can be further enhanced.

According to still another aspect of the present invention, since the lower substrate is provided with the heat dissipation openings and the heat dissipation fins corresponding to the positions of the heat dissipation openings of the upper substrate, openings penetrating in the thickness direction of this terminal board is formed in the substrate terminal board for mounting a semiconductor device. Therefore, as described above, convection of air around the substrate terminal board for mounting a semiconductor device passes through the heat dissipation openings due to heat generation of the semiconductor device, and the air of the convection flows while touching the heat dissipation fins of the upper substrate and the lower substrate, so that the heat dissipation property of the substrate terminal board for mounting a semiconductor device can be further enhanced.

According to still another aspect of the present invention, since the paint film of the lower substrate and the paint film of the upper substrate are bonded to each other by completely curing the paint film of the upper substrate, the lower substrate and the upper substrate can be connected to each other without using an adhesive, and the effect of simplifying the manufacture of the substrate terminal board for mounting a semiconductor device can be obtained.

According to still another aspect of the present invention, since the paint film on the upper surface of the lower substrate and the paint film of the upper substrate are bonded to each other by superposing the lower substrate and the upper substrate both having the half-cured paint film on each other and subjecting them to the pressure heating treatment with the space holding member interposed therebetween to completely cure the paint film, the effects can be obtained in which the lower substrate and the upper substrate can be held at a uniform interval by the presence of the space holding member, and the interval between the lower substrate and the upper substrate can be easily set at a desired interval by appropriately selecting the thickness of the space holding member.

According to still another aspect of the present invention, the heat dissipation fins positioned in the vicinity of the device mounting portion are cut and raised at an angle inclined toward the outside opposite to the device mounting portion side, so that light emission from the LED chip is not impaired when the LED chip is mounted on the device mounting portion. Further, there can be obtained a substrate terminal board for mounting a semiconductor device advantageous in avoiding interference between a machine such as a wire bonding machine and the heat dissipation fins when the machine is used to wire and connect not only the LED chip but also a semiconductor device disposed in the device mounting portion.

BRIEF DESCRIPTION OF DRAWINGS

FIG. 1 shows a substrate terminal board for mounting a semiconductor device according to a first embodiment of the present invention, wherein (a) is an explanatory view shown in a perspective state, and (b) is an explanatory view shown in a state where the substrate terminal board is separated into a lower substrate and an upper substrate.

FIG. 2 shows the lower substrate in the first embodiment in cross section taken along line A-A in FIG. 1, wherein (a) is an explanatory view showing a cross section of a lower substrate conductor plate, (b) is an explanatory view showing, in cross section, a state in which a paint film is applied to the lower substrate conductor plate, and (c) is an explanatory view showing, in cross section, the lower substrate in which the paint film is completely cured.

FIG. 3 shows the upper substrate in the first embodiment in cross section taken along line A-A in FIG. 1, wherein (a) is an explanatory view showing a cross section of an upper substrate conductor plate, (b) is an explanatory view showing, in cross section, a state in which a paint film is applied to the lower substrate conductor plate, and (c) is an explanatory view showing, in cross section, the upper substrate in which the paint film is half-cured.

FIG. 4 shows the connection between the lower substrate and the upper substrate in the first embodiment, wherein (a) is an explanatory view showing the superposition of the lower substrate and the upper substrate in cross section, and (b) is an explanatory view showing, in cross section, a state in which the paint films are bonded to each other by pressure heating.

FIG. 5 shows a second embodiment, wherein (a) is an explanatory view showing the substrate terminal board for mounting a semiconductor device in a state in which the lower substrate and the upper substrate are separated from each other, and (b) is an explanatory view showing the substrate terminal board for mounting a semiconductor device in a perspective state.

FIG. 6 shows a third embodiment, wherein (a) is an explanatory view showing the substrate terminal board for mounting a semiconductor device in a state in which the lower substrate and the upper substrate are separated from each other, and (b) is an explanatory view showing the substrate terminal board for mounting a semiconductor device in a perspective state.

FIG. 7 shows the connection between the lower substrate and the upper substrate in a fourth embodiment, wherein (a) is an explanatory view showing, in cross section, the superposition of the lower substrate and the upper substrate with the space holding member interposed therebetween, and (b) is an explanatory view showing, in cross section, a state in which the space holding member is disposed and the paint films are bonded to each other by pressure heating.

FIG. 8 shows a comparative example, wherein (a) is an explanatory view showing a substrate terminal board for mounting a semiconductor device in a state in which a lower substrate and an upper substrate are separated from each other, and (b) is an explanatory view showing the substrate terminal board for mounting a semiconductor device in a perspective state.

DESCRIPTION OF EMBODIMENTS

Next, the present invention will be described in detail on the basis of the embodiments shown in FIGS. 1 to 7.

Although the present invention will be described by taking an example for disposing an LED chip as an embodiment, the present invention is not limited to disposing an LED chip, and semiconductor devices such as LSIs and CPUs may be disposed.

FIG. 1 to FIG. 4 show a first embodiment, in which reference numeral 1 denotes a substrate terminal board for mounting a semiconductor device, which is formed by integrally superposing a lower substrate 2 and an upper substrate 3 as shown in FIG. 1. The substrate terminal board 1 for mounting a semiconductor device has a device mounting portion 4 in which an LED chip can be disposed at the center of the upper surface of the terminal board. Furthermore, substrate terminal board 1 also has electrode terminal portions 5 which are disposed apart from the device mounting portion at a terminal board edge portion and to which an electrode wire such as an electric cable for supplying electricity to the LED chip disposed in the device mounting portion can be connected.

(Lower Substrate, First Device Connection Terminal Portion)

The lower substrate 2 of the upper and lower substrates forming the substrate terminal board 1 for mounting a semiconductor device is formed by covering a conductor plate surface of a lower substrate conductor plate 6 formed of a conductive metal plate such as a copper material with an insulating paint film 7. In the center thereof, there is a convex surface, and a first device connection terminal portion 8 for connecting the LED chip is provided as a portion on which the surface of the conductor plate of the lower substrate conductor plate 6 is exposed at the convex surface without the paint film 7.

(Lower Substrate, First Electrode Terminal Portion)

In addition, a first electrode terminal portion 9, which is one of the electrode terminal portions 5, is provided on the surface of the lower substrate 2 on the side of one corner of the terminal board edge portion where the paint film 7 is not provided and the conductor plate surface of the lower substrate conductor plate 6 is exposed in a rectangular shape.

(Upper Substrate, Second Device Connection Terminal Portion)

The upper substrate 3 is formed by covering a conductor plate surface of an upper substrate conductor plate 10 formed of a conductive metal plate such as a copper material with an insulating paint film 7, similarly to the lower substrate 2. A second device connection terminal portion 12 for connecting the LED chip is provided, on the surface of a thin plate-shaped plate portion around a through hole 11 opened corresponding to the first device connection terminal portion 8 of the lower substrate conductor plate 6, as a portion on which the conductor plate surface of the upper substrate conductor plate 10 is exposed without the paint film 7.

In the substrate terminal board 1 for mounting a semiconductor device, the upper substrate 3 is superposed on and integrated with the lower substrate 2, so that the device mounting portion 4 in which the first device connection terminal portion 8 and the second device connection terminal portion 12 are exposed is formed at the center of the substrate terminal board 1 for mounting a semiconductor device.

(Upper Substrate, Second Electrode Terminal Portion)

On the surface of the upper substrate 3 on the side of one corner of the terminal board edge portion and on the side opposite to the first electrode terminal portion 9, a second electrode terminal portion 13 which is the other of the paired electrode terminal portions is provided where the paint film 7 is not provided and the conductor plate surface of the upper substrate conductor plate 10 is exposed in a rectangular shape as in the case of the first electrode terminal portion 9.

In the substrate terminal board 1 for mounting a semiconductor device, the upper substrate 3 is superposed on and integrated with the lower substrate 2, so that the pair of electrode terminal portions 5 composed of the first electrode terminal portion 9 and the second electrode terminal portion 13 are arranged while facing each other at the terminal board edge portion of the substrate terminal board 1 for mounting a semiconductor device.

(Upper Substrate—Heat Dissipation Fin, Heat Dissipation Opening)

Further, the upper substrate 3 is provided with heat dissipation fins 14 and heat dissipation openings 15 in a vertically and horizontally aligned manner at a plurality of positions surrounding the device mounting portion 4 of the substrate terminal board 1 for mounting a semiconductor device, that is, positions surrounding the through hole 11 and positions further outward. The respective heat dissipation fins 14 are formed by cutting and raising the upper substrate conductor plate 10 at the plurality of positions, and the heat dissipation openings 15 are provided as portions that penetrate and open in the thickness direction of the upper substrate conductor plate 10 as a result of cutting and raising the heat dissipation fins 14.

In the present embodiment, each of the heat dissipation fins 14 in the vicinity of the through hole 11 that becomes the device mounting portion 4 is folded up with one side of the heat dissipation opening 15, which is the opening as a result of cutting and raising, closer to the through hole 11 as its folding base end, but is cut and raised at an angle inclined toward the outside opposite to the through hole side so as not to impair the light emission from the LED chip mounted on the device mounting portion 4.

(Lower Substrate—Heat Dissipation Fin, Heat Dissipation Opening)

The lower substrate 2 is provided with heat dissipation fins 16 and heat dissipation openings 17 in a vertically and horizontally aligned manner at a plurality of positions surrounding the device mounting portion 4 of the substrate terminal board 1 for mounting a semiconductor device, that is, positions surrounding the portion of the first device connection terminal portion 8 and positions further outward. The respective heat dissipation fins 16 are formed by cutting and raising the lower substrate conductor plate 6 at the plurality of positions, and the heat dissipation openings 17 are provided as portions that penetrate and open in the thickness direction of the lower substrate conductor plate 6 as a result of cutting and raising the heat dissipation fins 16.

The heat dissipation fins 16 of the lower substrate 2 are cut and raised so that they can be inserted into the heat dissipation openings 15 corresponding to the heat dissipation openings 15 of the upper substrate 3. By superposing the lower substrate 2 and the upper substrate 3, the heat dissipation fins 16 of the lower substrate 2 are inserted into the heat dissipation openings 15 and erected in the same direction as the heat dissipation fins 14 so that they face to the heat dissipation fins 14 of the upper substrate 3 in a state of being apart from each other.

The heat dissipation openings 17 of the lower substrate 2 are positioned corresponding to the heat dissipation openings 15 of the upper substrate 3. The lower substrate 2 and the upper substrate 3 are superposed on each other, so that the heat dissipation openings 17 of the lower substrate 2 overlap with the heat dissipation openings 15 of the upper substrate 3 to form through portions passing through the substrate terminal board 1 for mounting a semiconductor device in the thickness direction of the terminal board 1.

In the periphery of the first device connection terminal portion 8 of the lower substrate 2, the erection height of the heat dissipation fins 16 is reduced, or only the heat dissipation openings 17 are formed while the heat dissipation fins are not provided in order to avoid interference with the heat dissipation fins 14 of the upper substrate 3 when the lower substrate 2 is superposed on the upper substrate 3.

(Upper and Lower Substrates, Paint Film)

Each of the paint films 7 of the lower substrate 2 and the upper substrate 3 is formed by applying electrodeposition coating using an electrodeposition paint having heat resistance and insulating properties to the surface of each conductor plate, precipitating the electrodeposition paint, and performing heat treatment as described later. As the electrodeposition paint, a polyimide resin, a polyamide resin, an epoxy resin, or preferably a polyamide imide resin, having excellent heat resistance and insulating properties may be used. In this embodiment, the paint film 7 is formed as a resin film layer having heat resistance and insulating properties.

Even in a state where the upper substrate 3 is superposed on and integrated with the lower substrate 2, the paint film 7 on the upper surface side of the lower substrate 2 and the paint film 7 on the lower surface side of the upper substrate 3 exist between the lower substrate conductor plate 6 and the upper substrate conductor plate 10, so that insulation between the lower substrate conductor plate 6 and the upper substrate conductor plate 10 is achieved.

(Manufacturing Method)

A manufacturing method of the first embodiment will next be described. The cross section shown in the drawing is a cross section at the same portion as the position along the line A-A in FIG. 1.

(Lower Substrate Conductor Plate, Upper Substrate Conductor Plate, FIG. 2(a), FIG. 3(a)

First, as shown in FIG. 2(a) and FIG. 3(a), a lower substrate conductor plate 6 and an upper substrate conductor plate 10 having a predetermined shape are prepared by punching using a stamping die for punching. The heat dissipation fins 16 are cut and raised in the lower substrate conductor plate 6 for obtaining the lower substrate 2 by this punching process or the like to form the heat dissipation openings 17. In addition, the heat dissipation fins 14 are cut and raised in the upper substrate conductor plate 10 for obtaining the upper substrate 3 by this punching process to form the heat dissipation openings 15. The same process is applied to form the through hole 11.

(Electrodeposition Coating with Electrodeposition Paint, FIG. 2 (b), FIG. 3(b))

Next, electrodeposition coating with an electrodeposition paint is applied to the lower substrate conductor plate 6 and the upper substrate conductor plate 10. Before coating with the electrodeposition paint, the lower substrate conductor plate 6 is provided with masks 19 for the portions to be the first device connection terminal portion 8 and the first electrode terminal portion 9, and the upper substrate conductor plate 10 is provided with masks for the portions to be the second device connection terminal portion 12 and the second electrode terminal portion 13. Then, electrodeposition paint is applied to the lower substrate conductor plate 6 and the upper substrate conductor plate 10, on which masking has been applied to the necessary portions, by electrodeposition coating, so that a paint film 7 is deposited and formed over the entire surfaces of the lower substrate conductor plate 6 and the upper substrate conductor plate 10. In the drawing, only the mask 19 to be applied to the first device connection terminal portion 8 is shown.

(Lower Substrate Conductor Plate, from Baking to Complete Curing, FIG. 2 (c))

The lower substrate conductor plate 6 on which the paint film 7 has been deposited and formed on the entire surface is subjected to a heat treatment (baking) at an appropriate temperature, so that the paint film 7 is baked and dried as shown in FIG. 2 (c) to completely cure the paint film 7. As a result, the lower substrate 2 having the completely cured paint film 7 having a specific uniform thickness is obtained.

(Upper Substrate Conductor Plate, from Baking to Half-Curing, FIG. 2 (c))

On the other hand, the upper substrate conductor plate 10 on which the paint film 7 has been formed on the entire surface is subjected to a heat treatment (baking) at an appropriate temperature, so that the paint film 7 is half-cured in a soft state as shown in FIG. 3(c), thereby obtaining the upper substrate 3 having the half-cured paint film 7.

(Superposition, FIG. 4(a))

Next, the upper substrate 3 having the half-cured paint film 7 as described above is superposed on the upper surface of the lower substrate 2 having the fully cured paint film 7. At the time of this superposition, as shown in FIG. 4(a), the heat dissipation fins 16 of the lower substrate 2 are allowed to pass through the heat dissipation openings 15 of the upper substrate 3 so that the heat dissipation openings 15 of the upper substrate 3 and the heat dissipation openings 17 of the lower substrate 2 are overlapped with each other.

In addition, the portion of the first device connection terminal portion 8 to which the mask 19 is applied on the lower substrate 2 is located outside through the through hole 11 of the upper substrate 3, so that the first device connection terminal portion 8 (lower substrate 2) and the second device connection terminal portion 12 (upper substrate 3), which are both masked, are exposed to the outside. Then, the lower substrate 2 and the upper substrate 3 are superposed on each other in a state in which the portion of the first electrode terminal portion 9 and the portion of the second electrode terminal portion 13, which are both masked, are also exposed to the outside.

(Pressure Heating, FIG. 4(b))

The superposed lower substrate 2 and upper substrate 3 are subjected to a pressure heating treatment for heating them at an appropriate temperature while pressurizing them with an appropriate pressure in the vertical direction to completely cure the half-cured paint film 7 of the upper substrate 3. The completely cured paint film 7 of the lower substrate 2 and the half-cured paint film 7 of the upper substrate 3 face each other and are in close contact with each other by the superposition, and the half-cured paint film 7 is completely cured by subjecting it to the pressure heat treatment. In the process of complete curing of the half-cured paint film 7, the paint film 7 of the lower substrate 2 and the paint film 7 of the upper substrate 3 are bonded to each other, so that the lower substrate 2 and the upper substrate 3 are firmly attached to each other. FIG. 4 (b) shows a state in which the paint film 7 is completely cured and bonded to each other.

As shown in FIG. 4(b), the paint film 7 having insulating properties exists between the lower substrate 2 and the upper substrate 3 which are attached to and integrated with each other by the above-mentioned pressure heating treatment, and the lower substrate 2 and the upper substrate 3 are connected in a laminated state in which they are electrically insulated from each other.

(Removal of Mask)

After the lower substrate 2 and the upper substrate 3 have been connected to each other in a laminated state by bonding the paint film 7 to each other by the pressure heating treatment, the masks are removed. As a result, the substrate terminal board 1 for mounting a semiconductor device is completed which has the device mounting portion 4 at which the first device connection terminal portion 8 and the second device connection terminal portion 12 are exposed to the outside, and the electrode terminal portion 5 at which the first electrode terminal portion 9 and the second electrode terminal portion 13 are exposed to the outside, and in which the heat dissipation openings 15 and 17 are disposed in a vertically overlapping state around the device mounting portion 4, and the heat dissipation fins 14 and 16 are disposed in a state that the heat dissipation fins 14 and 16 are cut and raised upward at the positions of the heat dissipation openings 15.

Second Embodiment, FIG. 5

In the first embodiment described above, the lower substrate 2 having the heat dissipation fins 16 and the heat dissipation openings 17 and the upper substrate 3 having the heat dissipation fins 14 and the heat dissipation openings 15 are superposed on each other, but the present invention is not limited to this embodiment. FIG. 5 shows a second embodiment, and, as shown in FIG. 5 (a), the lower substrate 2 is not provided with any heat dissipation fins, and only the heat dissipation openings 17 are provided at positions corresponding to the heat dissipation openings 16 of the upper substrate 3 shown in the first embodiment.

In the second embodiment, as shown in FIG. 5(b), the lower substrate 2 and the upper substrate 3 are superposed on each other so that the heat dissipation openings 17 of the lower substrate 2 and the heat dissipation openings 15 of the upper substrate 2 overlap with each other, and the lower substrate 2 and the upper substrate 3 are subjected to a pressure heating treatment to be connected to each other. Then, the masks are removed to obtain the substrate terminal board 1 for mounting a semiconductor device.

Third Embodiment, FIG. 6

Further, FIG. 6 shows a third embodiment, and in this third embodiment, as shown in FIG. 6 (a), the lower substrate 2 is not provided with any heat dissipation fins and heat dissipation openings. Also in the third embodiment, as shown in FIG. 6 (b), the lower substrate 2 and the upper substrate 3 are superposed on each other, and the lower substrate 2 and the upper substrate 3 are subjected to a pressure heating treatment to be connected to each other in the same manner as in the first and second embodiments. Then, the masks are removed to obtain the substrate terminal board 1 for mounting a semiconductor device.

Fourth Embodiment, FIG. 7

In the first, second, and third embodiments described above, the upper substrate 3 is superposed on the lower substrate 2 so that the half-cured paint film 7 of the upper substrate 3 comes into contact with the completely cured paint film 7 of the lower substrate 2: however, a substrate terminal board 1 for mounting a semiconductor device can also be obtained by a fourth embodiment described below.

In the fourth embodiment, the paint film 7 of the lower substrate 2 and the paint film 7 of the upper substrate 3 are bonded to each other in a state in which a space holding member 18 is disposed between the lower substrate 2 coated with the paint film 7 and the upper substrate 3 coated with the paint film 7 in the same manner, so that the lower substrate 2 and the upper substrate 3 are connected to each other in a laminated state. The space holding member 18 disposed as described can ensure the space between the lower substrate conductor plate 6 and the upper substrate conductor plate 10 more uniformly in the resulting substrate terminal board 1 for mounting a semiconductor device.
(Upper and Lower Substrate Conductor Plates, Paint Film-Half-Cured)

In the fourth embodiment, the lower substrate conductor plate 6 and the upper substrate conductor plate 10 on which the paint film 7 has been deposited and formed on the entire surfaces thereof by the electrodeposition coating using the electrodeposition paint are each subjected to a heat treatment at an appropriate temperature to form the paint film 7 in a half-cured soft state, so that the upper substrate 3 having the half-cured paint film 7 and the lower substrate 2 having the half-cured paint film 7 in the same manner are obtained.
(Superposition, Space Holding Member)

Before the lower substrate 2 and the upper substrate 3 are superposed, the space holding member 18 formed of glass beads or silica beads having a uniform diameter is disposed between the paint film 7 on the upper surface side of the lower substrate 2 and the paint film 7 on the lower surface side of the upper substrate 3 at substantially constant intervals. Then, the lower substrate 2 and the upper substrate 3 are superposed on each other with the space holding member 18 interposed therebetween. FIG. 7(*a*)

Of course, similarly to the above-described superposition in the first and second embodiments, the lower substrate 2 and the upper substrate 3 are superposed on each other such that, in the case where the lower substrate 2 is provided with the heat dissipation openings 17 and the upper substrate 3 is provided with the heat dissipation openings 15, the heat dissipation openings 17 of the lower substrate 2 overlaps the heat dissipation openings 15 of the upper substrate 3, and such that, in the case where the lower substrate 2 is provided with the heat dissipation fins 16 and the upper substrate 3 is provided with the heat dissipation fins 14 as in the first embodiment, the heat dissipation fins 16 of the lower substrate 2 are inserted into the heat dissipation openings 15 of the upper substrate 2.
(Pressure Heating)

Next, the superposed lower substrate 2 and upper substrate 3 are subjected to a pressure heating treatment for heating while maintaining a pressurized state in the vertical direction with an appropriate pressure, so that the paint film 7 of the lower substrate 2 and the paint film 7 of the upper substrate 3, which have been in a half-cured state as described above, are completely cured. In the process of complete curing of the half-cured paint film 7, the paint film 7 of the lower substrate 2 and the paint film 7 of the upper substrate 3 are bonded to each other, so that the lower substrate 2 and the upper substrate 3 are firmly attached to each other. FIG. 7 (*b*)

As shown in FIG. 7, since the paint films 7 are bonded to each other so as to interpose the space holding member 14 between the paint film 7 of the lower substrate 2 and the paint film 7 of the upper substrate 3, the space between the lower substrate conductor plate 6 and the upper substrate conductor plate 10 is ensured more uniformly while the lower substrate 2 and the upper substrate 3 are connected to each other.

Then, after the lower substrate 2 and the upper substrate 3 have been connected to each other in a laminated state by bonding of the paint film 7 through the above-mentioned pressure heating treatment, the masks are removed, thereby completing the substrate terminal board 1 for mounting a semiconductor device.

The fourth embodiment has adopted the space holding member 18 formed of glass beads, silica beads, or the like, but instead of glass beads and silica beads, a sheet material formed of a material similar to the material of the electrode-position paint may be adopted as the space holding member 18. For example, a polyamide imide resin sheet may be used.
(Comparison of Substrate Terminal Board)

Next, junction temperatures Tj (° C.) of LED chips were simulated and analyzed on the assumption that the dimensions of the substrate terminal board for mounting a semiconductor device as in Examples 1, 2, and 3 and Comparative Example 1 were 50 mm×42 mm, and electricity was supplied thereto in a state in which the LED chip was mounted. The comparison between Examples 1 to 3 and Comparative Example 1 was performed on the basis of the temperatures obtained by the simulation analysis. FIG. 8 shows a substrate terminal board for mounting a semiconductor device of Comparative Example 1 and a state in which the substrate terminal board is separated into a lower substrate and an upper substrate, and the same reference numerals are denoted to the same portions as those in the embodiment.

A substrate terminal board for mounting a semiconductor device according to the first embodiment having heat dissipation fins and heat dissipation openings in each of the lower substrate and the upper substrate was set as Example 1. A substrate terminal board for mounting a semiconductor device according to the second embodiment having heat dissipation openings in the lower substrate and having heat dissipation fins and heat dissipation openings in the upper substrate was set as Example 2. A substrate terminal board for mounting a semiconductor device according to the third embodiment having no heat dissipation opening and no heat dissipation fin in the lower substrate and having heat dissipation fins and heat dissipation openings in the upper substrate was set as Example 3. The junction temperatures of the LED devices attached to the respective substrate terminal boards were obtained.

Further, a substrate terminal board for mounting a semiconductor device having no heat dissipation opening and no heat dissipation fin in both the lower substrate and the upper substrate was set as Comparative Example 1, and the junction temperature of the LED device mounted on the substrate terminal board was obtained.
(Analysis Results)
Example 1 Tj=157.5° C.
Example 2 Tj=157.2° C.
Example 3 Tj=158.0° C.
Comparative Example 1 Tj=162.0° C.

Since the junction temperatures in Examples 1 to 3 having the heat dissipation fins and the heat dissipation openings are lower than that in Comparative Example 1 from the above analysis results, it can be judged that providing the heat dissipation fins and the heat dissipation openings in the board itself is excellent in reducing the temperature of the LED chip attached to the board.
(Temperature Distribution and Flow Rate Distribution by Simulation)

Further, as to Examples 1 to 3 and Comparative Example 1, the temperature distribution on the light source surface side (upper substrate side) at the time of light emission and the flow rate distribution of the air moving upward from the lower side of the substrate terminal board on the side of mounting the semiconductor device were analyzed and confirmed by simulation. As a result, in Comparative Example 1, the high temperature region spread widely in the substrate extending direction of the substrate terminal board was confirmed, and it was confirmed that the flow rate of the air flow upward from the lower side of the substrate terminal board was small.

On the other hand, as to Examples 1, 2, and 3, it was confirmed that the high temperature region did not spread over a wide range in the substrate extending direction of the substrate terminal board, and that the flow rate of the air flow upward from the lower side of the substrate terminal board was also larger than that in Comparative Example 1. In Examples 1 and 2, in particular, it was confirmed that the high temperature range is present only around the LED mounting portion, and that the flow rate of the air flow upward from the lower side of the substrate terminal board was large.

As described above, from the comparison between Examples 1 to 3 and Comparative Example 1, it was possible to judge that the heat dissipation property of the substrate terminal board for mounting a semiconductor device provided with the heat dissipation fins by cutting and raising the heat dissipation fin from the board was good, and the heat dissipation property of the substrate terminal board for mounting a semiconductor device provided with the heat dissipation fins and the heat dissipation openings was better.

(Radiation)

A comparative study was conducted on radiation in the upward direction of the substrate terminal board for mounting a semiconductor device in Examples 1 to 3 and Comparative Example 1. Comparison between Examples 1 to 3 and Comparative Example 1 reveals that Comparative Example 1 has a structure in which the lower surface of the upper substrate and the upper surface of the lower substrate are bonded to each other, whereas in Examples 1 to 3, the lower surface of the upper substrate and the upper surface of the lower substrate are erected as the surfaces of the heat dissipation fins and exposed on the surface, so that the surface area of each of Examples 1 to 3 is larger than that of Comparative Example 1. Therefore, it was judged that the heat dissipation effect by radiation was higher in Examples 1 to 3 than in Comparative Example 1.

Since the amount of increase in the surface area of Example 1 relative to Comparative Example 1 is substantially equal to that of Example 3, the heat dissipation effect by radiation can be judged to be equivalent by comparing Example 1 and Example 3. Further, since the lower substrate in Example 2 does not have heat dissipation fins which are erected but only has heat dissipation openings, the surface area of Example 2 is slightly smaller than those of Examples 1 and 3, when compared with Examples 1 and 3. Therefore, it can be judged that the heat dissipation effect by radiation is slightly reduced in Example 2 compared to Examples 1 and 3.

However, since the surface areas of Examples 1 to 3 are larger than that of Comparative Example 1 as described above, when the substrate terminal board for mounting a semiconductor device is obtained according to the present invention, the heat dissipation effect by radiation of the substrate terminal board for mounting a semiconductor device is sufficiently high.

REFERENCE SIGNS LIST

1 . . . substrate terminal board for mounting a semiconductor device
2 . . . lower substrate
3 . . . upper substrate
4 . . . device mounting portion
5 . . . electrode terminal portion
6 . . . lower substrate conductor plate
7 . . . paint film
8 . . . first device connection terminal portion
9 . . . first electrode terminal portion
10 . . . upper substrate conductor plate
12 . . . second device connection terminal portion
13 . . . second electrode terminal portion
14, 16 . . . heat dissipation fin
15, 17 . . . heat dissipation opening

The invention claimed is:

1. A method for manufacturing a substrate terminal board for mounting a semiconductor device having a device mounting portion in which a semiconductor device can be disposed, and an electrode terminal portion in which an electrode wire for supplying electricity to a semiconductor device disposed in the device mounting portion can be mounted, by superposing an upper substrate and a lower substrate each having conductivity, the method comprising:

forming the upper substrate by cutting and raising an upper substrate conductor plate formed of a conductive metal plate at a plurality of positions for heat dissipation fins in the upper substrate conductor plate around the device mounting portion to provide the heat dissipation fins and heat dissipation openings opened by cutting and raising the heat dissipation fins, and then by covering the upper substrate conductor plate with an insulating paint film;

forming the lower substrate by covering a lower substrate conductor plate formed of a conductive metal plate with an insulating paint film; and bonding the paint film of the lower substrate and the paint film of the upper substrate to each other by superposing the lower substrate and the upper substrate on each other, and subjecting them to a pressure heating treatment by pressurizing them from above and below while heating, to completely cure the paint film, so that the substrate terminal board for mounting a semiconductor device is obtained in which the lower substrate and the upper substrate are connected in a laminated state electrically insulated from each other by the bonding, and the heat dissipation fins coated with the paint film in a raised shape are located at side portions of the heat dissipation openings around the device mounting portion.

2. The method for manufacturing a substrate terminal board for mounting a semiconductor device according to claim 1, wherein the lower substrate conductor plate is provided with heat dissipation openings at positions corresponding to the heat dissipation openings in the upper substrate conductor plate, and the lower substrate conductor plate provided with the heat dissipation openings is coated with the paint film to form the lower substrate.

3. The method for manufacturing a substrate terminal board for mounting a semiconductor device according to claim 1, comprising:

forming the lower substrate by cutting and raising the lower substrate conductor plate at positions corresponding to the heat dissipation openings in the upper substrate conductor plate to provide heat dissipation fins insertable into the heat dissipation openings in the upper substrate conductor plate and heat dissipation openings opened by cutting and raising the heat dissipation fins, and then by covering the lower substrate conductor plate provided with the heat dissipation fins and the heat dissipation openings with the paint film; and superposing the lower substrate and the upper substrate on each other so that the heat dissipation fins of the lower substrate are inserted into the heat dissipation openings of the upper substrate and the heat dissipation openings of the lower substrate are positioned corresponding to the heat dissipation openings of the upper substrate, wherein by superposing the lower substrate and the upper substrate, the heat dissipation openings of the lower substrate and the heat dissipation openings of the upper substrate overlap with each other to form a penetrating portion passing in a terminal board thickness direction, so that the heat dissipation fins of the lower substrate are erected in the same direction as the heat dissipation fins of the upper substrate through the heat dissipation openings of the upper substrate.

4. The method for manufacturing a substrate terminal board for mounting a semiconductor device according to claim 1, comprising:

completely curing the paint film of the lower substrate by subjecting the lower substrate to a heat treatment before the lower substrate and the upper substrate are superposed on each other, and half-curing the paint film of the upper substrate by subjecting the upper substrate to a heat treatment before the lower substrate and the upper substrate are superposed on each other; and bonding the paint film of the lower substrate and the paint film of the upper substrate by superposing the lower substrate, in which the paint film has been completely cured, and the upper substrate, in which the paint film has been half-cured, on each other and by subjecting the superposed lower substrate and upper substrate to a pressure heating treatment to completely cure the half-cured paint film of the upper substrate, thereby.

5. The method for manufacturing a substrate terminal board for mounting a semiconductor device according to claim 1, comprising:

half-curing the paint film of the lower substrate by subjecting the lower substrate to a heat treatment before the lower substrate and the upper substrate are superposed on each other, and half-curing the paint film of the upper substrate by subjecting the upper substrate to a heat treatment before the lower substrate and the upper substrate are superposed on each other; and bonding the paint film of the lower substrate and the paint film of the upper substrate with the space holding member interposed therebetween by superposing the lower substrate, in which the paint film has been half-cured, and the upper substrate, in which the paint film has been half-cured, on each other with a space holding member interposed between the paint film of the lower substrate and the paint film of the upper substrate, and by subjecting the superposed lower substrate and upper substrate to the pressure heating treatment to completely cure the half-cured paint film of the upper substrate, thereby.

6. The method for manufacturing a substrate terminal board for mounting a semiconductor device according to claim 1, wherein the heat dissipation fins positioned in a vicinity of the device mounting portion are cut and raised at an angle inclined toward the outside opposite to the device mounting portion side.

* * * * *